(12) United States Patent
Kim et al.

(10) Patent No.: US 7,097,949 B2
(45) Date of Patent: Aug. 29, 2006

(54) PHASE EDGE PHASE SHIFT MASK ENFORCING A WIDTH OF A FIELD GATE IMAGE AND FABRICATION METHOD THEREOF

(75) Inventors: Dong-Hyun Kim, Seoul (KR);
Moon-Hyun Yoo, Suwon (KR);
Jeong-Lim Nam, Yongin (KR);
Yoo-Hyon Kim, Seoul (KR);
Chul-Hong Park, Yongin (KR);
Soo-Han Choi, Suwon (KR);
Young-Chan Ban, Yongin (KR);
Hye-Soo Shin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 155 days.

(21) Appl. No.: 10/688,591

(22) Filed: Oct. 17, 2003

(65) Prior Publication Data
US 2004/0091794 A1 May 13, 2004

(30) Foreign Application Priority Data
Oct. 22, 2002 (KR) ...................... 10-2002-0064641

(51) Int. Cl.
*G01F 9/00* (2006.01)

(52) U.S. Cl. ......................................................... 430/5
(58) Field of Classification Search ................... 430/5; 403/30; 716/19–21
See application file for complete search history.

(56) References Cited

U.S. PATENT DOCUMENTS

| 6,593,038 | B1 * | 7/2003 | Cho et al. ....................... 430/5 |
| 6,749,971 | B1 * | 6/2004 | Lukanc et al. .................. 430/5 |
| 6,787,271 | B1 * | 9/2004 | Cote et al. ...................... 430/5 |
| 2002/0188924 | A1 * | 12/2002 | Pierrat et al. .................. 716/19 |
| 2004/0043305 | A1 * | 3/2004 | Park et al. ...................... 430/5 |
| 2004/0076891 | A1 * | 4/2004 | Pierrat ............................ 430/5 |

\* cited by examiner

*Primary Examiner*—S. Rosasco
(74) *Attorney, Agent, or Firm*—F. Chau & Associates, LLC

(57) ABSTRACT

A phase edge phase shift mask and a fabrication method thereof for enforcing a width of a field gate image located on a field region, which is weakened by a two exposure process, by using a phase shift mask and a trim mask on a semiconductor substrate, and enforcing a width of the field gate image to maximize a current driving capability of the semiconductor device.

11 Claims, 7 Drawing Sheets

PHASE EDGE PHASE SHIFT MASK ENFORCING A WIDTH OF A FIELD GATE IMAGE AND FABRICATION METHOD THEREOF

CROSS-REFERENCE TO RELATED APPLICATION

This application claims priority to Korean Patent Application No. 2002-64641, filed on Oct. 22, 2002.

TECHNICAL FIELD

The present invention relates to a phase edge phase shift mask, and more particularly, to a phase edge phase shift mask enforcing a width of a field gate image located in a field region of a semiconductor substrate and a fabrication method thereof.

BACKGROUND

The use of a quartz mask board with the use of chromium for exposing a semiconductor substrate has been determined to cause optical interference between neighboring patterns with reduced design rules of a semiconductor device, thereby making it difficult to obtain desirable pitch sizes.

As a substitute, a phase shift mask has been proposed which implements precise and detailed patterns by reducing optical interference between the neighboring patterns on the semiconductor substrate with the use of chromium and molybdenum on the quartz mask board. A current trend is to use more than one phase-shift mask to obtain desired sizes as required by tighter design rules. In addition, a phase edge phase shift mask and a masking technique used in combination with a phase mask for exposing a semiconductor device has been determined to be beneficial.

For instance, a conventional phase edge phase shift mask technique is described in U.S. Pat. No. 5,807,649. With this process, two masks are used to form the same patterns (such as gate electrodes) on a semiconductor substrate. The two masks are composed of a phase shift mask and a trim mask.

Generally, a phase shift mask defines a predetermined portion of a photoresist image overlapping an active region of the semiconductor substrate by using shifters for shifting a phase of photo light.

Trim patterns on the trim mask form an entire shape of the photoresist image extended to a field region to protect the defined predetermined portion of the image from photo exposure. The photoresist image is a pattern made to form a gate pattern.

However, if an interval between the patterns is very narrow on the trim mask, the trim patterns are likely to contain defects that are detected during a checking process after the trim mask has been fabricated.

FIG. 1a is a portion of rough diagram of a phase shift mask, according to a conventional phase edge phase shift mask. Referring to FIG. 1a, the phase shift mask (10) has two shifters (20, 20-1). The two shifters (20, 20-1) are phase shift regions where light can be transmitted and separated by a predetermined interval (1S) on the phase shift mask (10).

Light passing through one of the two shifters (20, 20-1) has a 180-degree phase difference compared to light passing through the other shifter. The phase shift mask (10) is formed by the two shifters (20, 20-1) and a dark portion (15). The dark portion is formed using chromium for defining the shifters.

FIG. 1b is a rough image pattern of a phase shift mask formed on a semiconductor substrate, according to a conventional phase edge phase shift mask. Referring to FIG. 1b, the phase shift mask (10) of FIG. 1a overlaps an active region (27) on a semiconductor substrate (25), wherein the semiconductor substrate (25) is coated with a photoresist (29). And, open regions (31, 33) corresponding to the shifters (20, 20-1) of FIG. 1a are formed on the semiconductor substrate (25).

The active region (27) is depicted by dotted lines to illustrate that the region is overlapped with the shifters (20, 20-1) of FIG. 1a, and the semiconductor substrate (25) is divided into several areas (29, 31, and 33), including area (29) with the photoresist, and areas (31, 33) without the photoresist, corresponding to the shifters (20, 20-1) of FIG. 1a.

FIG. 1c is a portion of rough diagram of a trim mask, according to a conventional phase edge phase shift mask. Referring to FIG. 1c, the trim mask (35) is overlapped by the two shifters (20, 20-1) of FIG. 1a. The two shifters (20, 20-1) formed on the trim mask (35) are depicted by dotted lines, but the two shifters (20, 20-1) are not actually formed on the trim mask (35).

The trim mask (35) is divided into trim patterns (40, 41, 37, and 37-1) where light can not be transmitted, and a transparent region (39) where light can be transmitted. Preferably, the trim patterns are subdivided into three regions: a first trim pattern (40) having a predetermined width of 4W, and formed between the two shifters (20, 20-1); a second trim pattern (41) having a predetermined dimensions of 5W and 8W in the vertical/horizontal direction, respectively, and formed outside regions composed of the shifters (20, 20-1); and third trim patterns (37, 37-1) having the same width of 3W and overlapping the shifters (20, 20-1), and the third trim patterns (37, 37-1) are in contact with the second trim pattern (41).

The second trim pattern (41) is positioned away from a right boundary of the shifter (20-1) by a predetermined distance of 6W, and the third trim pattern (37-1) is positioned inside and away from the right boundary of the shifter (20-1) by a predetermined distance of 7W.

In other words, the second trim pattern (41) and the third trim pattern (37-1) are positioned away from the right boundary of the shifter (20-1) in opposite directions of one other, thereby forming a notch structure at a check point (1P).

The notch structure is a defect that can be detected at the check point (1P) in an inspection step after the trim mask (35) is fabricated. In other words, if a width of the notch structure is out of specification as compared to the tolerances as defined by a design rule at the check point (1P), an inspection process detects the notch structure as a defect.

Further, a portion of the notch structure overlaps a portion of the photoresist (29) of FIG. 1b. And, if light is transmitted through the portion of the notch structure that overlaps the photoresist of the trim mask (35) during a photo exposure process, an unwanted field gate image (not shown) is formed by sensitizing the photoresist (29) on the semiconductor substrate (25) of FIG. 1b.

FIG. 1d is a rough image pattern of a trim mask formed on a semiconductor substrate, according to a conventional phase edge phase shift mask. Referring to FIG. 1d, the trim mask (35) of FIG. 1c forms rough images (40-1, 41-1). The rough image (40-1) has a predetermined width of 4W-1, and overlaps the active region (27). The rough image (41-1) includes a vertical side portion having a predetermined width of 8W-1, and a horizontal portion having a predetermined height of 5W-1 on the semiconductor substrate (25).

The rough image (41-1) is formed when light passes through the notch structure on the trim mask (35) of FIG. 1c during an exposure process. Thus, the rough image (41-1) can be transferred to a gate having a very narrow width causing an increase in the resistance and drops in the current driving capability in a gate. In other words, the performance of the gate on the semiconductor device deteriorates.

Therefore, a need exists to enforce a width of a field image to improve the performance of a gate on a semiconductor device.

SUMMARY OF THE INVENTION

The present invention provides a method for enforcing a width of a field gate image located in a field region of a semiconductor device. According to an embodiment of the present invention, the method is provided to reduce the photoresist loss during a photo exposure process by preventing the formation of a notch structure formed between trim patterns on a trim mask by forming a region with a predetermined width between shifters and a second trim pattern on a field region, and forming a third trim pattern for protecting the predetermined region, thereby enforcing an image width on the field region.

According to another embodiment of the present invention, a method is provided to reduce photoresist loss during a photo exposure process by preventing the formation of a notch structure between trim patterns within a trim mask. The method comprises the steps of coinciding a side of a second trim pattern on a field region with boundaries of shifters opposite to the second trim pattern, coinciding selected sides of a third trim pattern with the boundaries, and forming a dummy pattern with a predetermined width on an opposite side of the second trim pattern adjacent to the shifters, thereby enforcing an image width on the field region.

According to another embodiment of the present invention, a phase edge phase shift mask comprises a plurality of shifters and an opaque region for defining the shifters; and a trim mask comprises first, second, and third trim patterns overlapped with the phase shift mask. The first trim pattern corresponds to an opaque region between the shifters, and the second trim pattern is connected to the first trim pattern separated from at least one shifter by a predetermined width. The third trim pattern is overlapped with the shifters and is adjacent to selected sides of the first and the second trim patterns.

It is desirable that a notch structure is removed by the third trim pattern being in contact with the first and the second trim patterns, and a separated region having a predetermined width between the shifts and the first trim pattern and the second trim pattern is protected by the third trim pattern. It is also desirable that the third trim patterns contact the first and the second trim patterns to prevent the formation of a notch structure.

It is more desirable that the shifters are phase shift regions formed to change a phase of incident light, and further have a dummy pattern attached to sides opposite to the selected sides on one side of the second trim pattern.

According to another embodiment of the present invention, a phase edge phase shift mask comprises the steps of: forming a plurality of shifters comprising phase shift regions; forming an opaque region for defining the shifters; preparing a phase shift mask comprising the shifters and the opaque region; forming a first trim pattern corresponding to the opaque region between the shifters; forming a second trim pattern separated from the shifters by a predetermined width; connecting the first trim pattern with the second trim pattern; forming a third trim pattern within boundaries defining the shifters and in contact with selected sides of the first and the second trim patterns; preparing a trim mask comprising the first, second, and the third trim patterns; and preparing the phase edge phase shift mask using the phase shift mask and the trim mask.

According to another embodiment of the present invention, a phase edge phase shift mask comprises a plurality of shifters; a phase shift mask comprises an opaque region for defining the shifters; and a trim mask comprising of a first to a third trim patterns and a dummy pattern overlapped with the phase shift mask. The first trim pattern corresponds to an opaque region between the shifters, and the second trim pattern is connected to the first trim pattern and is adjacent to at least one shifter. The dummy pattern is attached to a side opposite to a second trim pattern side faced with the shifters. The third trim pattern is adjacent to selected sides of the first and the second trim patterns by overlapping with the shifters.

It is desirable that the third trim pattern removes a notch structure by being adjacent to the first and the second trim patterns, and protects separated regions having a predetermined width between the first and the second trim patterns. The shifters are phase shift regions formed to change a phase of incident light.

According to another embodiment of the present invention, a method of fabricating a phase edge phase shift mask, comprises the steps of: forming a plurality of shifters comprising phase shift regions; forming an opaque region for defining the shifters; preparing a phase shift mask comprising the shifters and the opaque region; forming a first trim pattern corresponding to the opaque region between the shifters; forming a second trim pattern adjacent to the shifters; forming a dummy pattern on a side opposite to a second trim side adjacent to the shifters; connecting the first trim pattern with the second trim pattern; forming a third trim pattern in contact with selected sides of the first and the second trim patterns by being overlapped within the shifters; preparing a trim mask where the first to the third trim patterns are formed; and preparing the phase edge phase shift mask composed of the phase shift mask and the trim mask.

According to another embodiment of the present invention, a method of fabricating a phase edge phase shift mask enforcing a width of a field gate image comprising the steps of: forming a plurality of shifters comprising phase shift regions; forming an opaque region for defining the shifters; preparing a phase shift mask comprising the shifters and the opaque region; forming a first trim pattern corresponding to the opaque region between the shifters; forming a second trim pattern adjacent to the shifters; forming a dummy pattern on an opposite side of the second trim pattern side adjacent to the shifters; connecting the first trim pattern with the second trim pattern; forming a third trim pattern in contact with selected sides of the first and the second trim patterns by overlapping the selected sides within the shifters, and wherein the third trim pattern is disposed within an outer boundaries of the shifters; preparing a trim mask comprising the first, second, and the third trim patterns; and preparing the phase edge phase shift mask using the phase shift mask and the trim mask.

These and other embodiments, features, aspects, and advantages of the present invention will be described and become apparent from the following detailed description of the preferred embodiments when read in conjunction with the accompanying drawings.

DESCRIPTION OF PREFERRED EMBODIMENTS

Figure 1A:
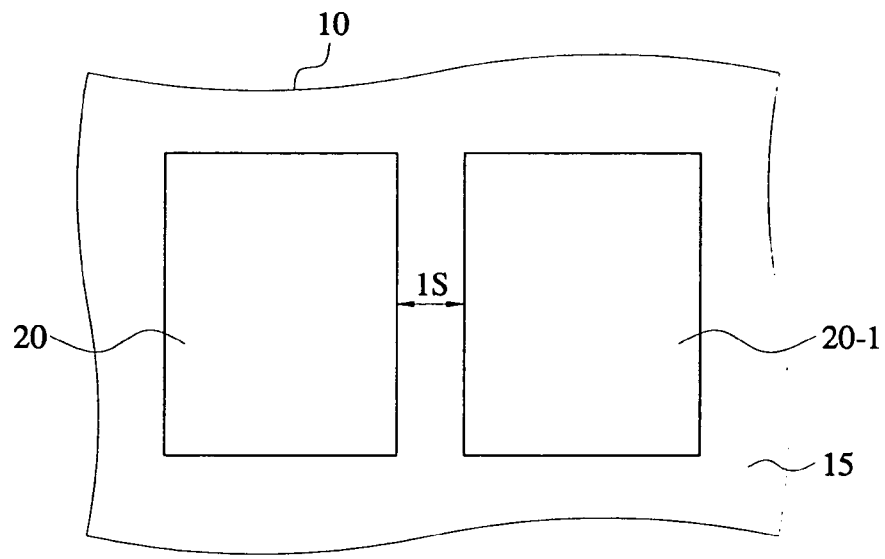
FIG. 1a is a portion of a rough diagram of a phase shift mask, according to a conventional phase edge phase shift mask.
Figure 1B:
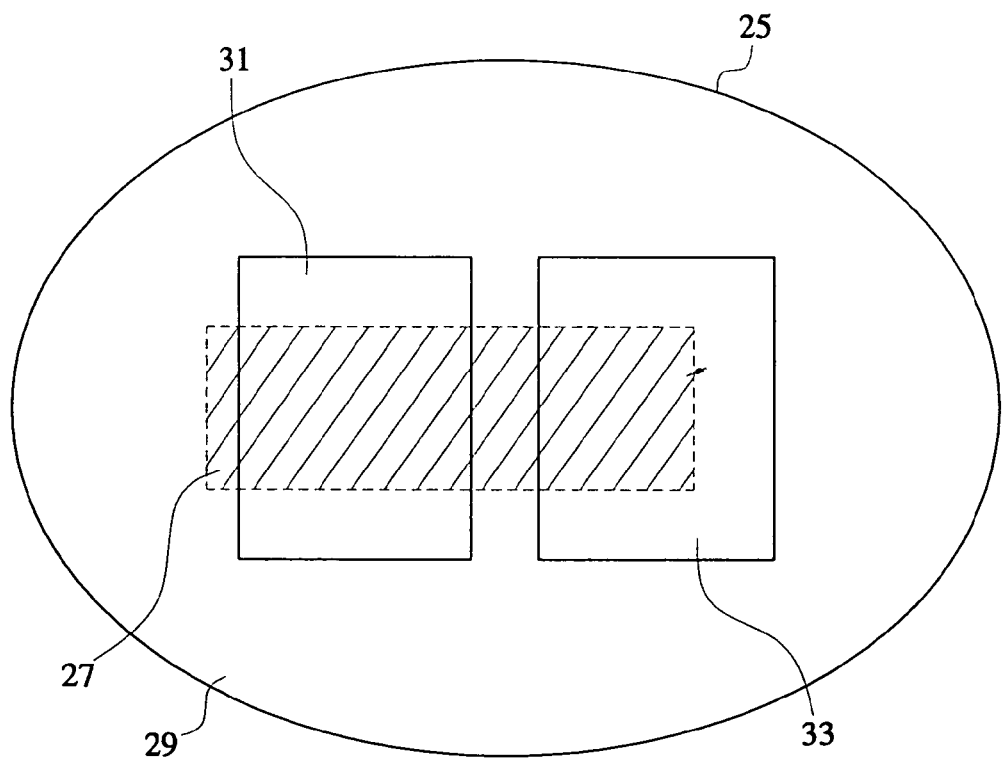
FIG. 1b is a rough image pattern of a phase shift mask formed on a semiconductor substrate, according to a conventional phase edge phase shift mask.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 2A:
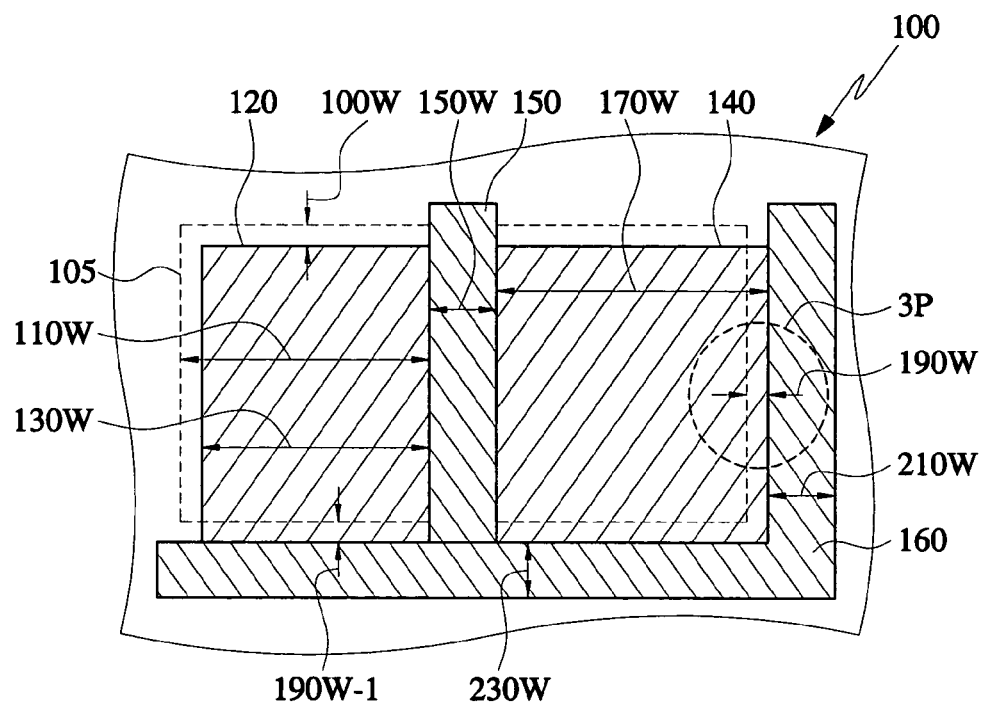
FIG. 2a is a phase edge phase shift mask illustrating a portion of rough diagram of a trim mask overlapped by a plurality of shifters, according to an embodiment of the present invention.

FIG. 2a is an examplary phase edge phase shift mask illustrating a portion of a rough diagram of a trim mask overlapped by a plurality of shifters, according to an embodiment of the present invention. Referring to FIG. 2a, the trim mask (100) comprises first and second trim patterns (150, 160), which are overlapped by two shifters (105) having the same width of 110W, and third trim patterns (120, 140).

A phase mask is comprises two shifters (105), transparent regions, and an opaque region (not shown) for defining the two shifters. Light passes through one of the two shifters (105) at a 180-degree phase difference compared to light passing through the other shifter.

The first trim pattern (150) of the first trim mask (100) has a predetermined width of 150W corresponding to an active region (not shown), and the second trim pattern (160) includes a vertical side portion having a predetermined width of 210W and a horizontal base portion having a predetermined height of 230W corresponding to a field region (not shown). The field region is the region outside the two shifters (105) corresponding to an active region.

Figure 1C:
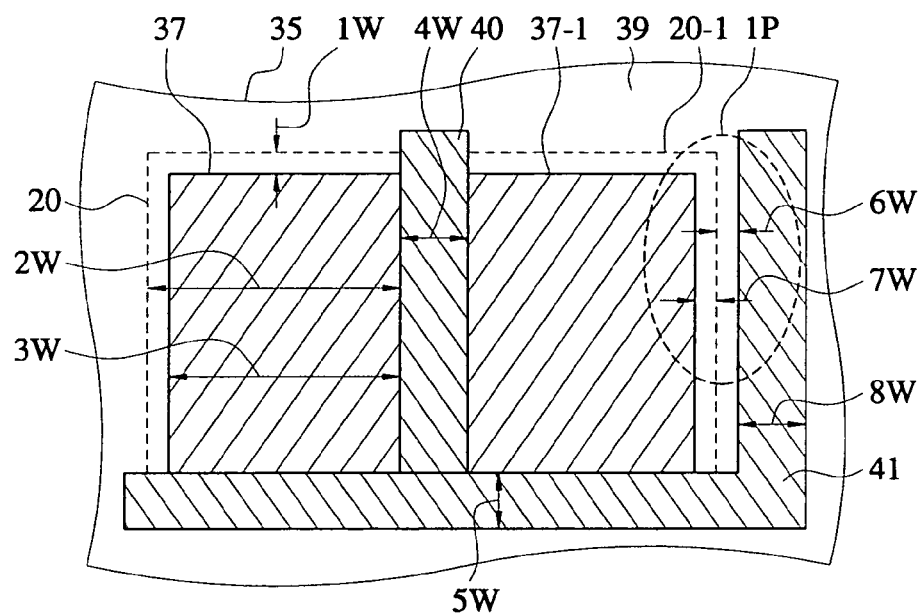
FIG. 1c is a portion of rough diagram of a trim mask, according to a conventional phase edge phase shift mask.

The third trim patterns (120, 140) of the trim mask (100) have of 130W and 170W, respectively, to prevent the formation of a notch structure as shown in FIG. 1c at a check point (3P). Thus, the notch structure is prevented from forming because the third trim patterns (120, 140) substantially cover a surface of the shifters (105). Preferably, the third trim pattern (120) extends over a predetermined region 190W-1, which is a predetermined distance between the shifters (105) and the horizontal base portion of the second trim pattern (160), to connect with the horizontal base portion of the second trim pattern (160), and the third trim pattern (140) extends over the predetermined distance 190W-1 to connect with the horizontal portion of the second trim pattern (160) and to connect with the vertical portion of the second trim pattern (160) covering a predetermined distance of 190W, which is a predetermined distance between the right most shifter (105) and a side wall of the vertical portion of the second trim pattern (160) facing the shifters and the third trim pattern (140).

The side portions of the third trim patterns (120, 140) that are not in contact with the first trim pattern (150) and the second trim pattern (160) are positioned inside and at a predetermined distance of 100W from a top boundary of the shifters (105). The first trim pattern (150) is disposed between the two shifters (105) and is connected the horizontal base portion of the second trim pattern (160) formed outside the two shifters (105).

Figure 2B:
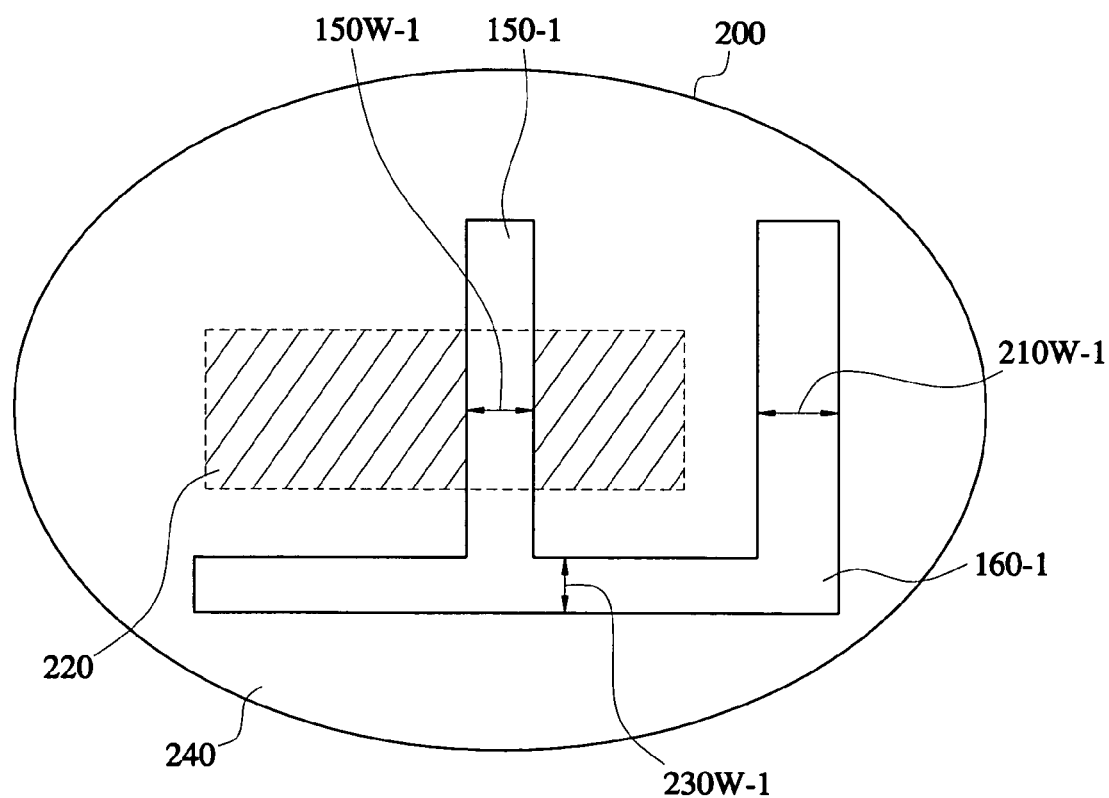
FIG. 2b is shows a phase edge phase shift mask illustrating rough images formed by a phase shift mask and a trim mask on a semiconductor substrate, according to an embodiment of the present invention.

FIG. 2b illustrates rough images formed by a phase shift mask and a trim mask on a semiconductor substrate, according to an embodiment of the present invention. Referring to FIG. 2b, the rough images (150-1, 160-1) are formed by two consecutive photo exposure processes (not shown) on a semiconductor substrate (200) coated with a photoresist. In other words, the rough images (150-1, 160-1) are formed by using two shifters (105) of FIG. 2a depicted by dotted lines and a trim mask (100).

Through the photo exposure process, the rough images (150-1, 160-1) are formed. Rough image (150-1) has a predetermined width of 150W-1 and overlaps an active region (220). The rough images (150-1, 160-1) are connected on the field region (240). Rough image (160-1) includes a vertical side portion having a predetermined width of 210W-1, and a horizontal base portion having a predetermined height of 230W-1.

Figure 1D:
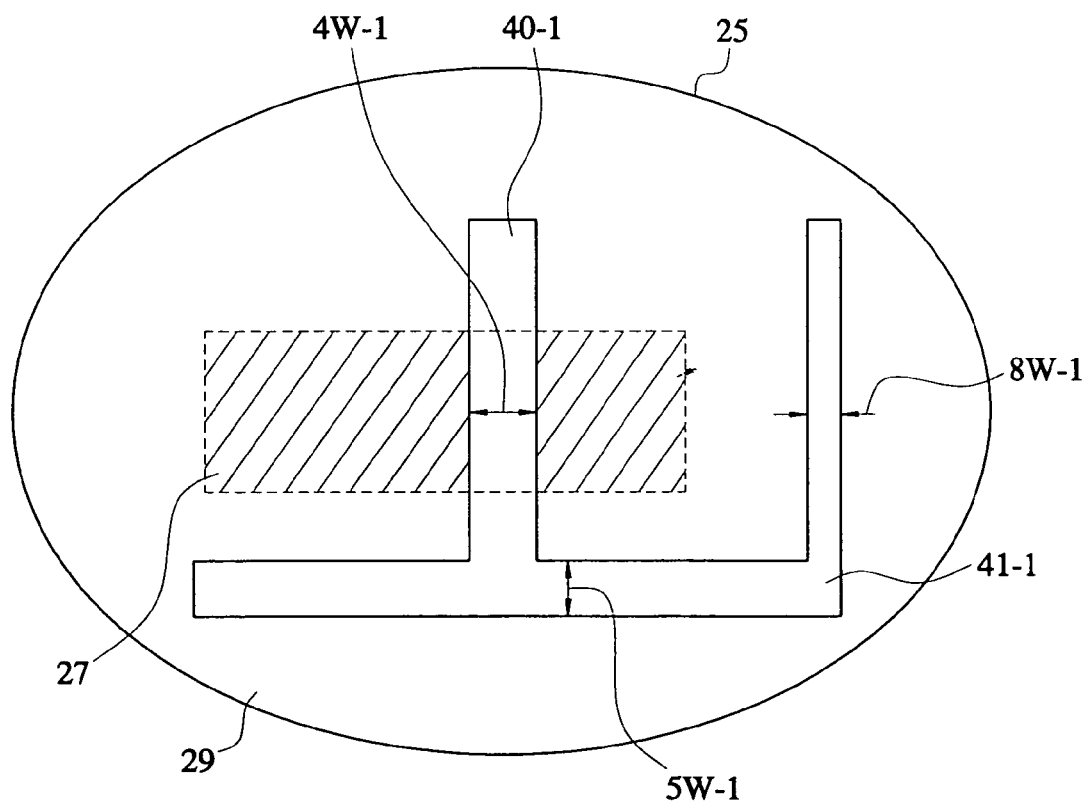
FIG. 1d is a rough image pattern of a trim mask formed on a semiconductor substrate, according to a conventional phase edge phase shift mask.

Compared to FIG. 1d, the rough image (160-1) has been enforced by removing a notch structure on the trim mask (100) of FIG. 2a and by covering the horizontal/vertical separation between the second trim pattern (160) from the shifters (105) by predetermined widths of 190W and 190W-1, respectively, with the third trim patterns.

Further, the rough images (150-1, 160-1) connected to the field region (240) on the semiconductor substrate (200) illustrate the photoresist loss by a photo exposure process.

Figure 2C:
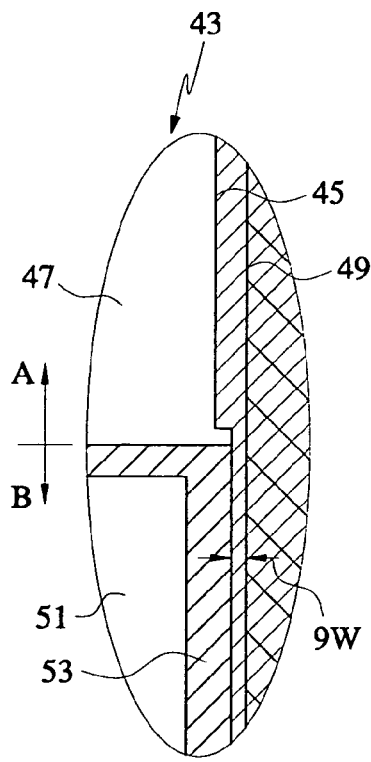
FIG. 2c illustrates a portion of wiring diagram formed by a conventional phase edge phase shift mask.

FIG. 2c illustrates a portion of wiring diagram formed by a conventional phase edge phase shift mask. Referring to FIG. 2c, the wiring diagram shows a portion of the phase edge phase shift mask where a second trim pattern (53) within a trim mask (not shown) is separated from a third trim pattern (49) by a predetermined width of 9W between shifters (45) of a phase shift mask (not shown).

In addition, the wiring diagram (43) can be divided into an upper surface (A) and a lower surface (B) by an upper side of the second trim pattern (53).

In the wiring diagram (43), since the second/third trim patterns (53, 49) are separated at the lower surface (B) by a predetermined width of 9W, a region opened to the shifters (45) of the phase shift mask is opened again during photo exposure (not shown) with the use of the trim mask, thereby the photoresist (not shown) protected by the second trim pattern (53) may be lost.

With the loss of the photoresist, an image width formed on field regions (47, 51) is narrower than a predetermined wiring width. Also, a gate width is reduced after an etching process, which increases the resistance and drops the current driving capability of a gate.

Figure 2D:
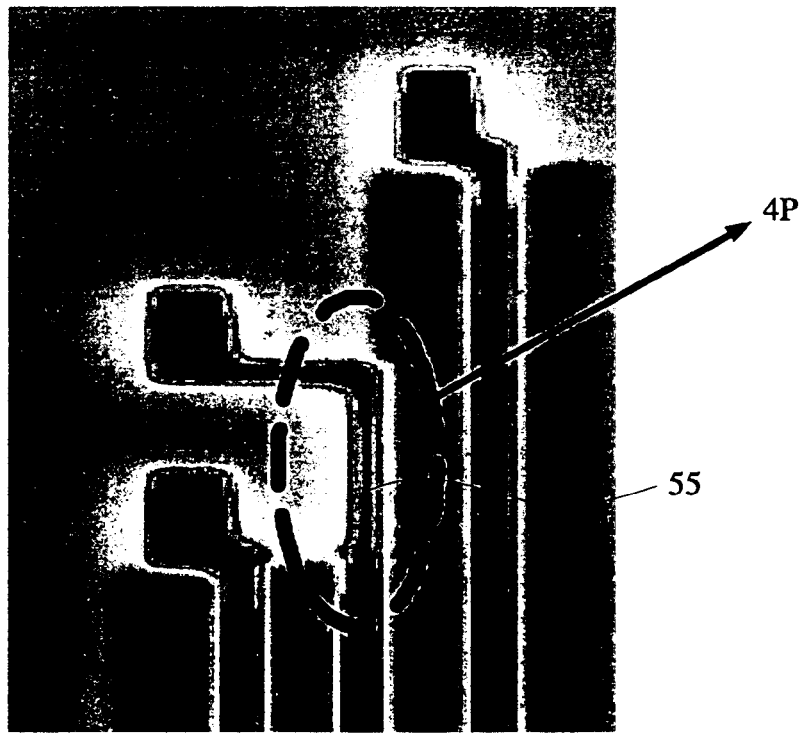
FIG. 2d illustrates an image picture after photo simulation on a conventional phase edge phase shift mask.

FIG. 2d illustrates an image picture after photo simulation on a conventional phase edge phase shift mask. Referring to FIG. 2d, FIG. 2d illustrates a simulation image (55). It is expected that a photoresist pattern is formed by using the phase edge phase shift mask (not shown) of FIG. 2c on a semiconductor substrate (not shown).

The photo simulation has been performed under the operating conditions of 200 nm defocus and 20 nm misalignment. The phase edge phase shift mask has the second/third trim patterns (53, 49) separated by a predetermined width of 9W as in FIG. 2c at a check point (4P).

Since a photo exposure (not shown) is performed through the separated region, the simulation image (55) is created in the check point (4P) owing to the loss of a photoresist protected by the second trim pattern (53). The simulation image (55) is nearly disconnected by two photo exposure processes, and the photoresist does not perform a role as an etching mask in a subsequent etching process.

Figure 2E:
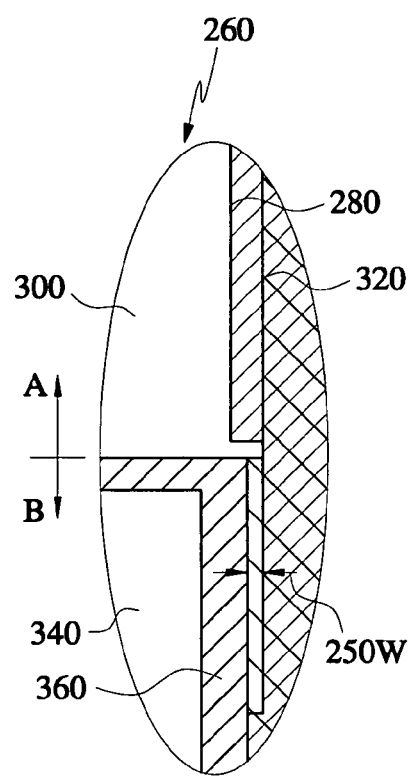
FIG. 2e illustrates a portion of wiring diagram formed by the phase edge phase shift mask, according to an embodiment of the present invention.

FIG. 2e illustrates a portion of wiring diagram formed by the phase edge phase shift mask, according to an embodiment of the present invention. Referring to FIG. 2e, the wiring diagram (260) shows a portion of the phase edge phase shift mask where shifter (280) of a phase shift mask (not shown) overlaps a second/a third trim patterns (320, 360) of a trim mask (not shown).

Furthermore, the wiring diagram (260) can be conveniently divided into an upper surface (A) and a lower surface (B) by an upper side portion of the second trim pattern (360). The shifter (280) is separated from the second trim pattern (360) by a predetermined width of 250W, and a photoresist (not shown) remains in a separated region.

The third trim pattern (320) protects the separated region in the lower surface (B) in the wiring diagram (260), and is adjacent to a boundary line of the second trim pattern (360).

In the wiring diagram (260), the photoresist remaining by the shifter (280) obtains a better photoresist image because a left side of the photoresist has been enforced by cutting off photo light with use of the third trim pattern (320) on the trim mask during a photo exposure process.

Figure 2F:
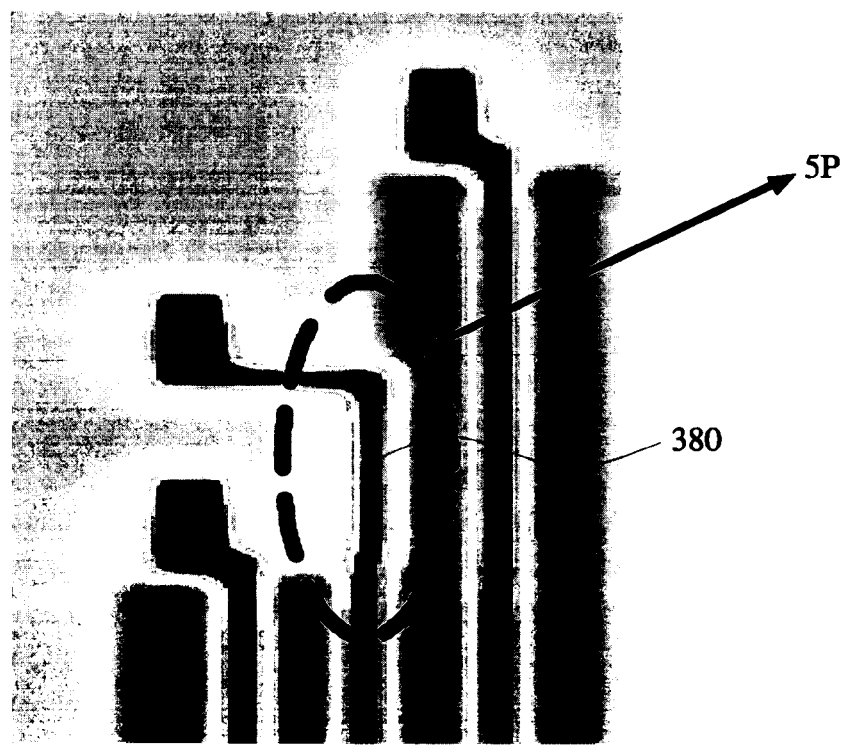
FIG. 2f illustrates an image picture after photo simulation, according to an embodiment of the present invention.

FIG. 2f illustrates an image picture after photo simulation, according to an embodiment of the present invention. Referring to FIG. 2f, the simulation image (380) illustrates an expected photoresist pattern being formed by using the phase edge phase shift mask (not shown) of FIG. 2e on a semiconductor substrate (not shown).

In other words, if the phase edge phase shift mask has the second trim pattern (360) and the shifter (280) separated by a predetermined width of 250W, as shown in FIG. 2e at a check point (5P), a photoresist is enforced because the third trim pattern (320) protects a separated region. Therefore, it is possible to create the simulation image (380) on a field region in the check point (5P).

The simulation image (380) shows that the photoresist on a left side is enforced without losing an upper part of the photoresist as compared to the simulation image (55) of prior art of FIG. 2d.

And, the simulation image (380) performs a better role as an etching mask than the prior art for a subsequently proceeding etching process (not shown). The photo simulation has been performed under operating conditions of 200 nm defocus and 20 nm misalignment.

Figure 3A:
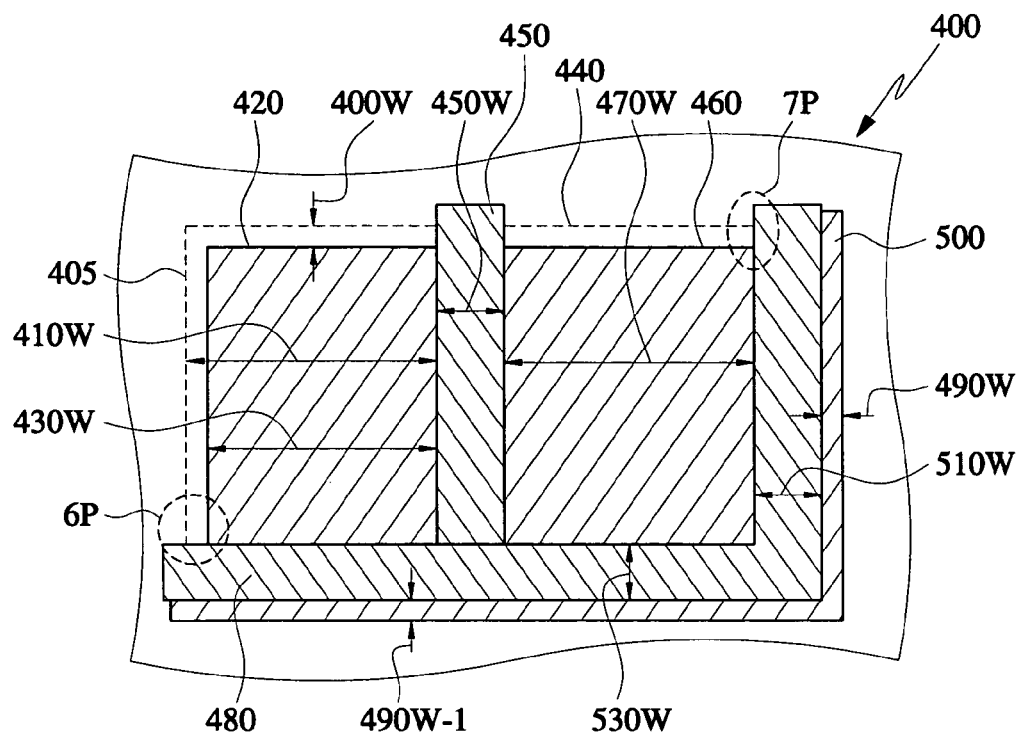
FIG. 3a is a phase edge phase shift mask illustrating a trim mask overlapped by a plurality of shifters, according to another embodiment of the present invention.

FIG. 3a illustrates an exemplary trim mask (400) overlapped by a plurality of shifters, according to another embodiment of the present invention. Referring to FIG. 3a, the trim mask (400) comprises first and second trim patterns (450, 480), which are overlapped by two shifters (405, 440) having predetermined widths of 410W and 470W, respectively, third trim patterns (420, 460), and a dummy pattern (500).

The phase mask is comprises two shifters (405, 440), transparent regions, and an opaque region (not shown) for defining the shifters. Light passing through the shifter (405) has a 180-degree phase difference compared to light passing through the shifter (440), wherein the shifters are separated at a regular interval.

The first trim pattern (450) of the trim mask (400) has a predetermined width of 450W and corresponds to an active region. The second trim pattern (480) includes a vertical side portion having a predetermined width of 510W and a horizontal base portion having a predetermined height of 530W corresponding to a field region.

The first trim pattern (450) is positioned between the two shifters (405, 440), and is connected to the second trim pattern (480) formed outside the two shifters (405, 440) having a predetermined width of 450W. The field region indicates a region outside the two shifters (405, 440).

Moreover, the trim mask (400) has the second trim pattern (480) adjacent to the two shifter, and attaches the third trim patterns (420, 460) having predetermined widths of 430W and 470W, respectively, and to the first pattern (450) to prevent the formation of a notch structure similar to one shown in FIG. 1c.

The third trim patterns (420, 460) are positioned within the two shifters (405, 440). Preferably, the third trim patterns (420, 460) are disposed by a predetermined width of 400W from a top boundary of the shifters (405, 440).

The trim mask (400) has a dummy pattern (500) adjacent to an opposite side of a second trim pattern (480) side that faces the two shifters (405, 440), and the dummy pattern (500) has a vertical side portion having a predetermined width of 490W and a horizontal base portion having a predetermined height of 490W-1.

The formation of the dummy pattern (500) enforces a photoresist image width (not shown) of a field region decreasing in check points (6P, 7P) by a photo exposure process (not shown), and prevents the reduction of the image width of the second trim pattern (480) because the dummy pattern (500) and the two shifters (405, 440) are adjacent to the second trim pattern (480).

Figure 3B:
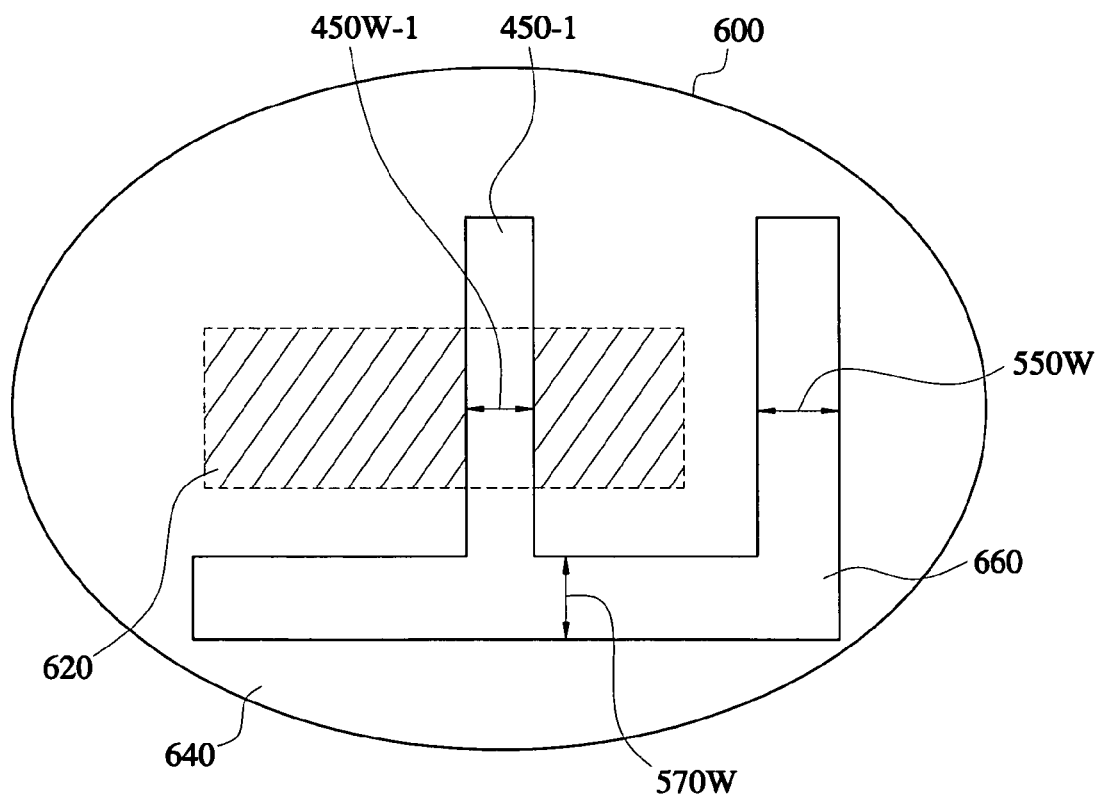
FIG. 3b illustrates rough images formed by a phase shift mask and a trim mask on a semiconductor substrate, according to another embodiment of the present invention.

FIG. 3b illustrates rough images formed by a phase shift mask and a trim mask on a semiconductor substrate, according to another embodiment of the present invention. Referring to FIG. 3b, the rough images (450-1, 660) are formed in a consecutive photo exposure of a semiconductor substrate (600) coated with a photoresist, by using a phase shift mask (not shown) with the shifters (405, 440) depicted by dotted lines and the trim mask (400) of FIG. 3a.

In addition, the rough images (450-1, 660) are formed. Rough image (450-1) has a predetermined image width of 450W-1 and overlaps an active region (620), and rough image (660) includes a vertical side portion having a predetermined width of 550W and a horizontal base portion having a predetermined height of 570W on a field region (640). In addition, rough images (450-1, 660) are connected to the field region (640).

Comparing to FIG. 1d to FIG. 3a, the rough image (660) has a enforced image width, by preventing the formation of a notch structure and attaching a dummy pattern (500) within the trim mask (400). Rough images (450-1, 660) and the field region (640) on the semiconductor substrate (600) illustrates the loss of a photoresist by a photo exposure process.

Figure 3C:
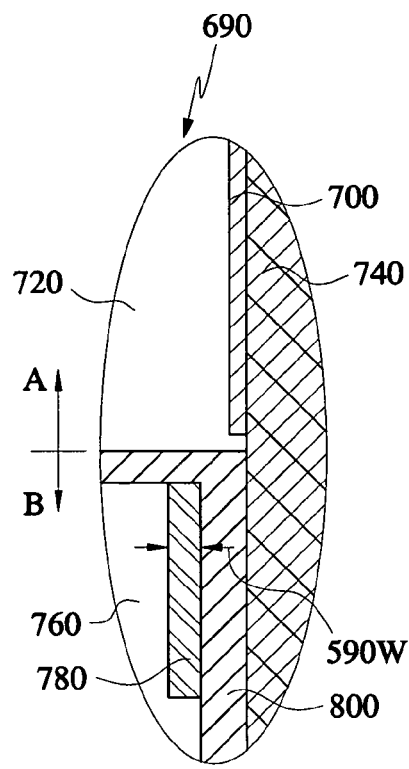
FIG. 3c illustrates a portion of wiring diagram formed by a phase edge phase shift mask, according to another embodiment of the present invention.

FIG. 3c illustrates a portion of wiring diagram formed by a phase edge phase shift mask, according to another embodiment of the present invention. Referring to FIG. 3c, in the wiring diagram (690), shifter (700) on a phase shift mask (not shown) is overlapped with a second and a third trim patterns (800, 740) on a trim mask (not shown), and the wiring diagram shows a portion of the phase edge phase shift mask including a dummy pattern (780) attached to the second trim pattern (800).

Furthermore, the wiring diagram (690) can be conveniently divided into an upper surface (A) and a lower surface (B) by an upper side portion of the second trim pattern (800).

In the lower surface (B) of the wiring diagram (690), the shifter (700) and the third trim pattern (740) are in contact with the second trim pattern (800), and the shifter (700) is shown outside the third trim pattern (740) in the upper surface (A) of the wiring diagram (690).

The dummy pattern (780) is in contact with a side of a second trim pattern (800) that is opposite to the side facing the shifters (700).

Figure 3D:
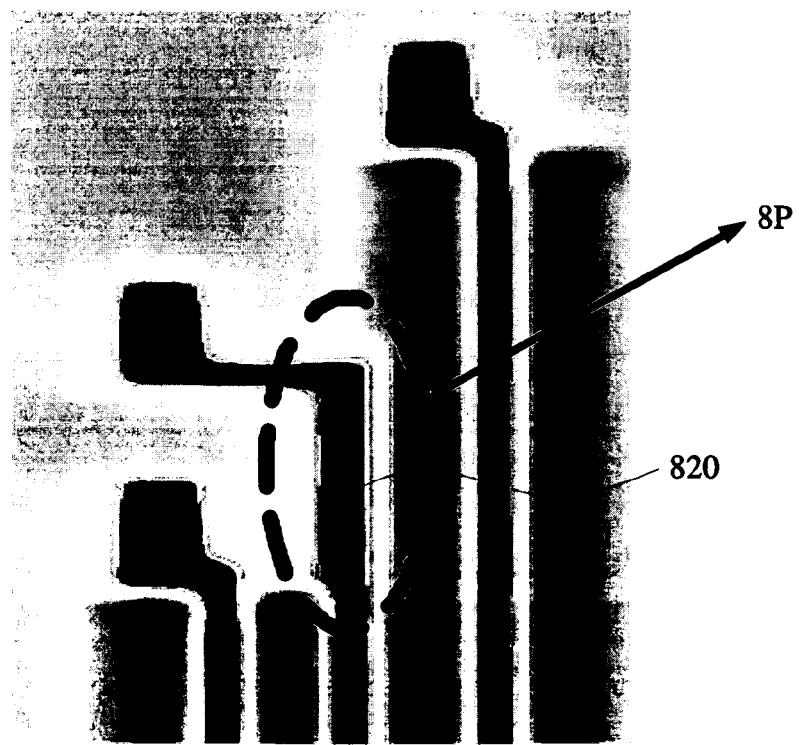
FIG. 3d illustrates an image picture after photo simulation, according to another embodiment of the present invention.

FIG. 3d illustrates an image picture after photo simulation, according to another embodiment of the present invention. Referring to FIG. 3d, a simulation image (820) illustrates it is expected that a photoresist pattern is formed by using the phase edge phase shift mask (not shown) of FIG. 3c on a semiconductor substrate (not shown).

In the phase edge phase shift mask, if the shifter and the third trim pattern are adjacent to the second trim pattern, as shown in FIG. 3c, in a check point (8P) and a dummy pattern is attached to one side of the second trim pattern, a photoresist is enforced by the third trim pattern and the dummy pattern. Therefore, the simulation image (820) can be formed on a field region at the check point (8P).

The simulation image (820) shows a photoresist that is enforced to the right without losing an upper part of the photoresist as compared to the simulation image (55) as shown in FIG. 2d of the prior art. Thus, the simulation image (820) performs a better role as an etching mask for a subsequent etching process (not shown).

The photo simulation was performed under the operating conditions of 200 nm defocus and 20 nm misalignment.

The embodiments of the present invention use a phase edge phase shift mask to prevent a notch structure from forming between trim patterns and to protect a region formed by separating the shifters from the second trim pattern by using a third trim pattern. Further, the image of FIG. 3d illustrates a enforce width of an image of FIG. 2d by attaching a dummy pattern to the second trim pattern.

Accordingly, the present invention provides a phase edge phase shift mask for reducing photoresist loss during a two exposure processes by controlling overlap intervals between shifters on a phase shift mask and first to third trim patterns on a trim mask, and preventing the formation a notch structure between trim patterns on the trim mask. As a result, the phase edge phase shift mask increases design performance by improving the current driving capability of a semiconductor device.

While the present invention has been particularly shown and described with reference to preferred embodiments thereof, it will be understood by those of ordinary skill in the art that various changes in form and detail may be made therein without departing from the spirit and scope of the present invention as defined by the following claims.

What is claimed is:

1. A mask for forming a device layer, comprising:
    a phase shift mask comprising a plurality of shifters and an opaque region for defining the shifters; and
    a trim mask comprising first, second, and third trim patterns overlapped with the phase shift mask, wherein the first trim pattern corresponds to an opaque region between the shifters, the second trim pattern is connected to the first trim pattern and is separated from at least one shifter having a predetermined width, and the third trim pattern is in contact with selected sides of the first and the second trim patterns.

2. The mask of claim 1, wherein the third trim pattern contacts the first and the second trim patterns to prevent the formation of a notch structure.

3. The mask of claim 1, wherein a region separated by a predetermined width between the shifters and the first and the second trim patterns is protected by the third trim pattern.

4. The mask of claim 1, wherein the shifters comprise phase shift regions that are formed to change a phase of incident light.

5. The mask of claim 1, wherein a dummy pattern is attached to the second trim pattern along a side opposite to the selected sides of the second trim pattern in contact with the first and third trim patterns.

6. A method of fabricating a mask for forming a device layer, comprising the steps of:
    forming a plurality of shifters comprising of phase shift regions;
    forming an opaque region for defining the shifters;
    preparing a phase shift mask comprising of the shifters and the opaque region;
    forming a first trim pattern corresponding to the opaque region between the shifters;
    forming a second trim pattern separated from the shifters by a predetermined width;
    connecting the first trim pattern with the second trim pattern;
    forming a third trim pattern within boundaries of the shifters and in contact with selected sides of the first and the second trim patterns by overlapping within the shifters;
    preparing a trim mask comprising the first, second, and the third trim patterns; and
    preparing the phase edge phase shift mask using the phase shift mask and the trim mask.

7. A mask for forming a device layer, comprising:
a phase shift mask comprising a plurality of shifters and an opaque region for defining the shifters; and
a trim mask comprising first, second, and third trim patterns overlapped with the phase shift mask and a dummy pattern, wherein the first trim pattern corresponds to an opaque region between the shifters, the second trim pattern is connected to the first trim pattern and is adjacent to at least one shifter, the dummy pattern is attached to an opposite side of the second trim pattern side that faces the shifters, and the third trim pattern is in contact with selected sides of the first and the second trim patterns by overlapping within shifters.

8. The mask of claim 7, wherein the third trim pattern contacts the first and the second trim patterns to prevent the formation of a notch structure.

9. The mask of claim 7, wherein the third trim pattern protects a region separated by a predetermined width between the shifters and the first and the second trim patterns.

10. The mask of claim 7, wherein the shifters comprise phase shift regions that are formed to change a phase of incident light.

11. A method of fabricating a mask for forming a device layer, comprising the steps of:

forming a plurality of shifters comprising phase shift regions;

forming an opaque region for defining the shifters;

preparing a phase shift mask comprising the shifters and the opaque region;

forming a first trim pattern corresponding to the opaque region between the shifters;

forming a second trim pattern adjacent to the shifters;

forming a dummy pattern on an opposite side of the second trim pattern side adjacent to the shifters;

connecting the first trim pattern with the second trim pattern;

forming a third trim pattern in contact with selected sides of the first and the second trim patterns by overlapping the selected sides within the shifters, and wherein the third trim pattern is disposed within an outer boundary of the shifters;

preparing a trim mask comprising the first, second, and the third trim patterns; and preparing the mask for forming a device layer using the phase shift mask and the trim mask.

* * * * *